(12) United States Patent
Stribley et al.

(10) Patent No.: US 8,378,451 B2
(45) Date of Patent: Feb. 19, 2013

(54) CAPACITOR AND A METHOD OF MANUFACTURING A CAPACITOR

(75) Inventors: Paul Ronald Stribley, Devon (GB); Mark Parsons, Devon (GB); Graham Chapman, Devon (GB)

(73) Assignee: X-FAB Semiconductor Foundries AG (DE)

( * ) Notice: Subject to any disclaimer, the term of this patent is extended or adjusted under 35 U.S.C. 154(b) by 361 days.

(21) Appl. No.: 12/669,733

(22) PCT Filed: Jul. 18, 2008

(86) PCT No.: PCT/GB2008/050600
§ 371 (c)(1),
(2), (4) Date: Jun. 7, 2010

(87) PCT Pub. No.: WO2009/013533
PCT Pub. Date: Jan. 29, 2009

(65) Prior Publication Data
US 2010/0237465 A1 Sep. 23, 2010

(30) Foreign Application Priority Data

Jul. 20, 2007 (GB) .................................. 0714065.0

(51) Int. Cl.
*H01L 29/92* (2006.01)
(52) U.S. Cl. ...................................................... 257/532
(58) Field of Classification Search .................. 257/532, 257/E29.343, E21.008; 438/396
See application file for complete search history.

(56) References Cited

U.S. PATENT DOCUMENTS

| | | | |
|---|---|---|---|
| 5,872,695 A | 2/1999 | Fasano et al. | |
| 6,195,249 B1 * | 2/2001 | Honda et al. | 361/306.3 |
| 6,680,521 B1 * | 1/2004 | Kar-Roy et al. | 257/532 |
| 6,709,918 B1 | 3/2004 | Ng et al. | |
| 2005/0121744 A1 | 6/2005 | Chang et al. | |
| 2005/0219796 A1 | 10/2005 | Narendra et al. | |
| 2006/0118965 A1 | 6/2006 | Matsui | |
| 2006/0119753 A1 | 6/2006 | Luo et al. | |
| 2006/0197184 A1 | 9/2006 | Oi et al. | |
| 2007/0152295 A1 | 7/2007 | Yeh et al. | |

OTHER PUBLICATIONS

International Preliminary Report on Patentability dated Jan. 26, 2010 in Application No. PCT/GB2008/050600.
ISR and Written Opinion from corresponding Int'l Application No. PCT/GB08/050600 dated Dec. 18, 2008.
GB Search Report from corresponding GB Application No. GB 0714065.0 dated Oct. 5, 2007.

* cited by examiner

*Primary Examiner* — Zandra Smith
*Assistant Examiner* — Paul Patton
(74) *Attorney, Agent, or Firm* — Snell & Wilmer L.L.P.

(57) ABSTRACT

A device comprises a substrate (22); a first MiM capacitor (10,20,11) disposed over the substrate; and a second MiM capacitor (10',20',11) disposed over the first MiM capacitor. The first MiM capacitor and the second MiM capacitor are electrically connected in parallel. The two MiM capacitors are vertically stacked one above the other.

Each MiM capacitor comprises an interconnection layer (10, 10') of the CMOS process as one plate and a thinner conductive layer (11,11') as the second plate, with an insulating layer (20,20') disposed therebetween. This allows each MiM capacitor to be formed between two CMOS process interconnection layers.

The second plate of the second MiM capacitor is substantially co-extensive with the second plate of the first MiM capacitor, and is disposed substantially directly over the second plate of the first MiM capacitor. The same mask may be used to pattern the second plate of the second MiM capacitor and the second plate of the first MiM capacitor. This minimizes the number of masks required, and so minimizes the mask investment cost.

22 Claims, 3 Drawing Sheets

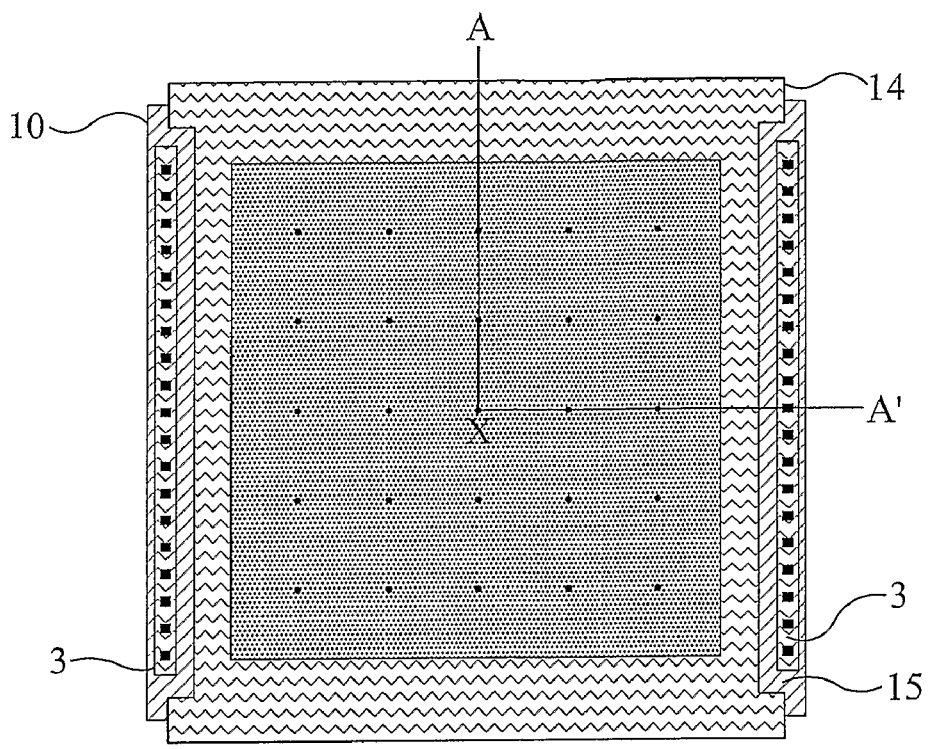
Fig 3
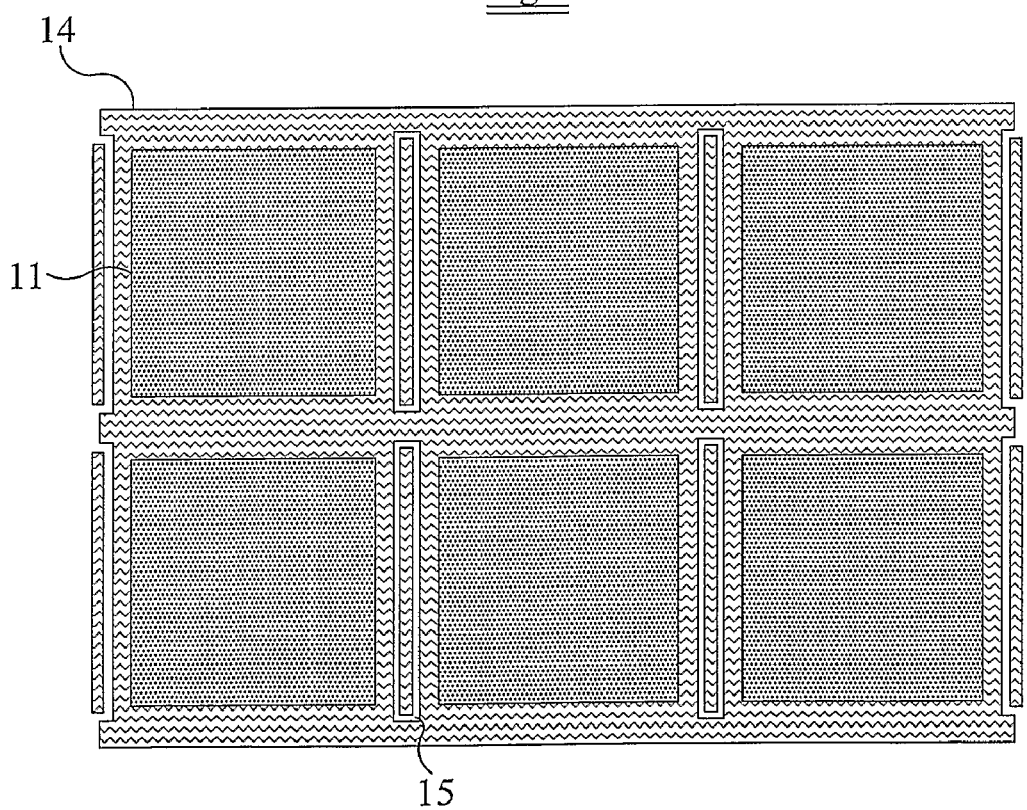
Fig 4 - Array of unit capacitor

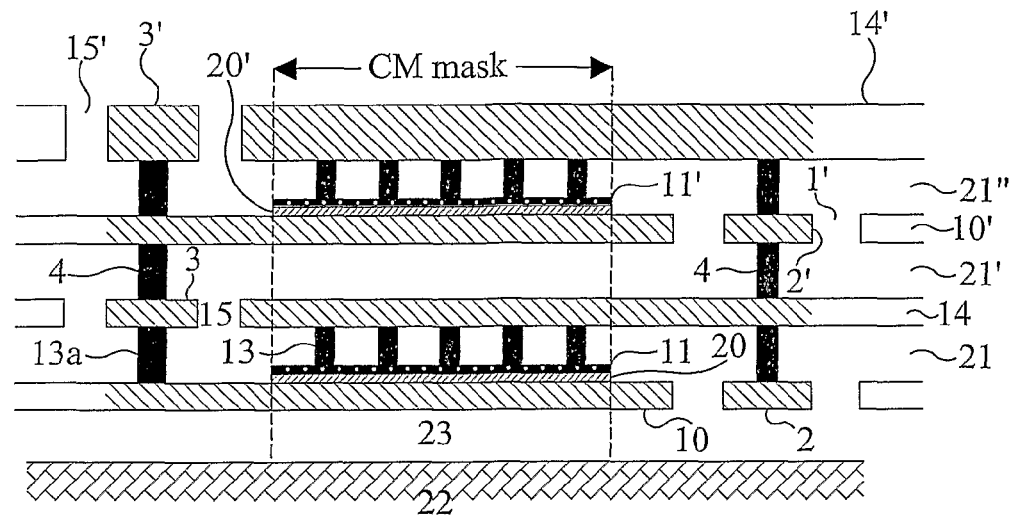
Fig 5 - Sectional diagram of double MiM stack using four connecting metal layers
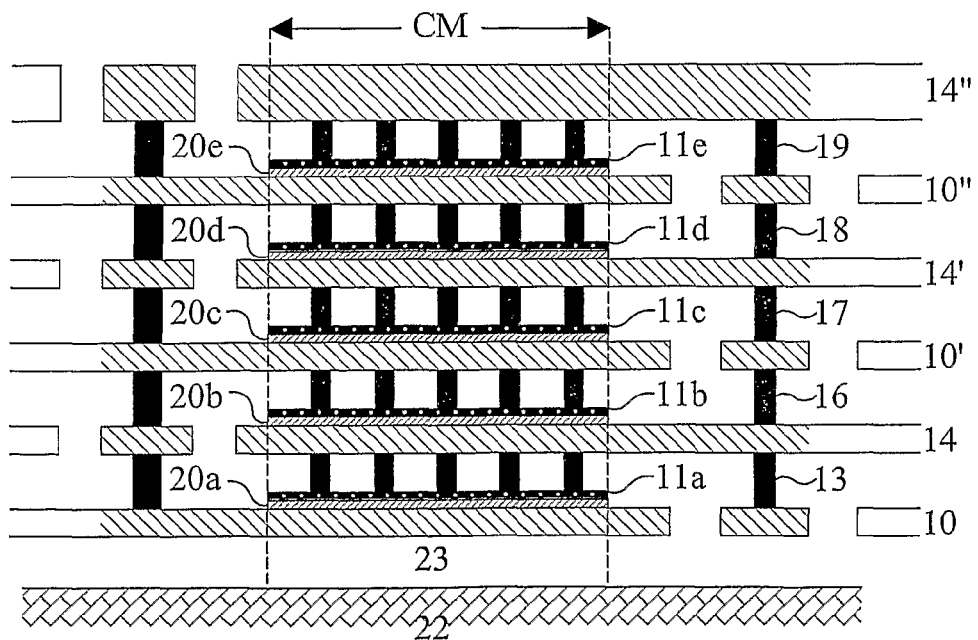
Fig 6 - Sectional diagram of five MiM stack using six connecting metal layers

CAPACITOR AND A METHOD OF MANUFACTURING A CAPACITOR

CROSS-REFERENCE TO RELATED APPLICATIONS

This application is U.S. national phase filing under 35 U.S.C.§371 of PCT/GB2008/050600 filed Jul. 18, 2008 and claims priority from United Kingdom Application No's. GB 0714065.0 which was filed on Jul. 20, 2007 and which are incorporated herein by reference.

The present invention relates to a capacitor, and to a method of manufacturing a capacitor. In particular it relates to a stacked capacitor and to the manufacture thereof.

Capacitors are widely used in planar silicon semiconductor processes and can be combined with many other components, eg transistors and resistors on integrated circuits (ICs). The need for capacitors with a relatively high value of capacitance on an IC can cause problems for circuit designs, because high capacitance values require a capacitor of comparatively large physical area as compared to other types of components. The overall circuit yield in IC manufacturing is directly related to the physical area occupied by an IC, as this determines how many ICs may be fitted onto one wafer. Hence, minimising or reducing the area occupied by a capacitor of an IC offers improved yield.

Capacitors are usually made of two conducting plates extending in close proximity, with a thin non-conducting material (eg a dielectric material) sandwiched between them. To maximise the capacitance the dielectric layer is kept very thin. Materials with large dielectric constants may also be used to maximise the capacitance. However, the thickness control of thinner layers is sometimes more challenging when the component is manufactured. Also, the dielectric breakdown voltage will reduce directly with the thickness of the dielectric layer—so limiting the maximum voltage that can be applied across a device. Thinner dielectric layers tend to conduct more current with applied bias, and have poorer reliability, compared to thicker layers owing to the greater electric fields which they need to sustain in circuits. The choice of dielectric material and its thickness needs to be a compromise between, on the one hand, the desire to minimise thickness and so maximise the value of capacitance and, on the other hand, the constraints of required voltage operating range, reliability and manufacturability (yield and thickness control).

The parasitic capacitance to a substrate is likewise directly related to the physical area of a capacitor component. This is the capacitance set up between the bottom plate of the capacitor and the underlying substrate. Capacitor quality is often measured as a ratio of the capacitance value to the parasitic capacitance. Maximisation of the ratio makes the capacitor more advantageous to a circuit design. A large capacitance to substrate can also impact the performance of a capacitor component for high frequency operation.

Parasitic resistance to the capacitor plates can also limit the usefulness of a device at high frequency. Lower resistances are better. Hence capacitors intended for operation at high frequencies tend to have highly conductive materials used for the top and bottom plates. These may be made of metal, highly doped semiconductor, or semiconductor combined with metallic compounds such as a metal-silicide.

Capacitors need to be highly linear with applied voltage to be most useful in analogue circuits—eg amplifiers. Hence the solution most often used for linear components is a metal-insulator-metal capacitor (MiM). In this case the top and bottom conducting plates are metal. The insulator layer can be a thin layer of silicon nitride, which has a relatively high dielectric constant, although other materials can be used—eg silicon dioxide or silicon oxynitride.

One of the constraints of making a MiM component is the physical size of the device and the impact this has on thermal reliability. Metal plates thermally expand and contract at different rates to the dielectric layer in between. This leads to a danger that the metal and insulator layers may become separated (delaminated) when the device is thermally cycled. To solve this problem, capacitors are made using a matrix of small cells connected together in parallel. Within each cell the capacitor plates are quite small so that the expansion is minimal and the region is stable. The overall size of the capacitor can however be large.

Another concern for mechanical stability is that large metal areas should be avoided. If a metal area is too large the stress within the layer, and the stresses between the layer and the surfaces above and below it can be excessive—particularly when the wafer is temperature cycled. Hence large metal areas need to be broken up, usually by providing stress-relieving slots in them. This is a normal feature of modern semiconductor processes. However it is also a potential issue when fabricating large area metal-insulator-metal capacitors because it forces the capacitor plates to be slotted. This can waste area within the capacitor and hence lower the effective capacitance per unit area.

Stacked capacitors are known. For example, U.S. Pat. No. 7,180,120 discloses a dual stacked MiM capacitor formed on a semiconductor substrate. The dual stacked MiM capacitor includes a lower plate, an upper plate electrically connected to and placed over the lower plate, and an intermediate plate interposed between the lower plate and the upper plate. However, the capacitor of U.S. Pat. No. 7,180,120 requires a complicated fabrication process.

As a further example, US 2007/0152295 discloses a stack capacitor structure having first and overlying second MiM capacitors electrically connected in parallel. The first and second MiM capacitors have different compositions of capacitor dielectric layer, such that one of the capacitor dielectric layers has a negative VCC (voltage linearity coefficient) characteristic whereas the other of the capacitor dielectric layers has a positive VCC characteristic. This minimizes the overall VCC characteristic of the stack structure.

A first aspect of the present invention provides a device comprising: a substrate; a first MiM capacitor disposed over the substrate; and a second MiM capacitor disposed over the first MiM capacitor, the first MiM capacitor and the second MiM capacitor being electrically connected in parallel; wherein the first MiM capacitor comprises: a first electrically conductive layer; a first insulating layer disposed over the first electrically conductive layer; a second electrically conductive layer; a second insulating layer disposed over the second electrically conductive layer; and a first wiring layer disposed over the second insulating layer and electrically connected to the second electrically conductive layer by one or more via connections through the second insulating layer; wherein the second MiM capacitor comprises: a third electrically conductive layer; a third insulating layer disposed over the third electrically conductive layer; a fourth electrically conductive layer; a fourth insulating layer disposed over the fourth electrically conductive layer; and a second wiring layer disposed over the fourth insulating layer and electrically connected to the fourth electrically conductive layer by one or more via connections through the fourth insulating layer; wherein the fourth electrically conductive layer is substantially co-extensive with the second electrically conductive layer, and is disposed substantially directly over the second electrically conductive layer; wherein slots are provided in the first wiring layer; and wherein the device comprises first vias extending from the first electrically conductive layer to the third electrically conductive layer, the first vias passing through a slot in the first wiring layer.

By making the fourth electrically conductive layer substantially co-extensive with the second electrically conductive layer it is possible to use the same mask in the steps of patterning both layers. This simplifies the fabrication process, and reduces the cost of producing masks required to make a device by reducing the number of masks required.

The device may be electrically configured as a single capacitor by suitably electrically connecting the first and second capacitors together, so as to provide a capacitor with a high capacitance per unit area.

The device is not limited to two capacitors, but may alternatively include three or more capacitors.

The first and third electrically conductive layers and the first and second wiring layers may be interconnection layer of the CMOS process. This allows the production of a stacked capacitor in a way that is fully compatible with mainstream semiconductor IC fabrication processes.

A second aspect of the present invention provides a device comprising: a substrate; a first MiM capacitor disposed over the substrate; and a second MiM capacitor disposed over the first MiM capacitor, the first MiM capacitor and the second MiM capacitor being electrically connected in parallel; wherein the first MiM capacitor comprises: a first electrically conductive layer; a first insulating layer disposed over the first electrically conductive layer; a second electrically conductive layer; a second insulating layer disposed over the second electrically conductive layer; and a first wiring layer disposed over the second insulating layer and electrically connected to the second electrically conductive layer by one or more via connections through the second insulating layer; wherein the second MiM capacitor comprises: the first wiring layer; a third insulating layer disposed over the first wiring layer; a third electrically conductive layer; a fourth insulating layer disposed over the third electrically conductive layer; and a second wiring layer disposed over the fourth insulating layer and electrically connected to the fourth electrically conductive layer by one or more via connections through the fourth insulating layer; wherein the third electrically conductive layer is substantially co-extensive with the second electrically conductive layer, and is disposed substantially directly over the second electrically conductive layer; wherein slots are provided in the first wiring layer; and wherein the device comprises first vias extending from the first electrically conductive layer to the second wiring layer, the first vias passing through a slot in the first wiring layer.

This aspect of the invention corresponds generally to the first aspect, except that one interconnection layer of the CMOS process acts both as the wring layer connected to the upper plate of one MiM capacitor and as the lower plate of the next MiM capacitor of the stack.

The device may comprise a plurality of cells, and the length of the slots in the first wiring layer may be less than the corresponding dimension of the cells, whereby the first wiring layer is continuous between adjacent cells. This allows the first wiring layer to be continuous between cells thereby facilitating electrical contact to the individual cells, while providing the slots relieves thermal stresses in the structure.

To obtain full benefit of the relief of thermal stress, slots may be provided in each of the first conductive layer, first wiring layer, third conductive layer and second wiring layer in a device of the first aspect or in each of the first conductive layer, first wiring layer and second wiring layer in a device of the second aspect. Advantageously, the length of the slots in each of the layer may be less than the corresponding dimension of the cells, so that each of the layers is continuous between adjacent cells.

A third aspect of the present invention provides a method as defined in claim 18, which may be used to fabricate a structure of the first aspect.

A fourth aspect of the present invention provides a method as defined in claim 21, which may be used to fabricate a structure of the second aspect.

Other features of the invention are set out in the dependent claims.

Preferred examples of the present invention will now be described by way of illustrative example with reference to the accompanying figures in which:

FIGS. 1, 2 and 3 show successive stages of a method of fabricating a stacked capacitor according to one embodiment of the invention, showing one unit cell of the stacked capacitor;

FIG. 4 is a plan view of a stacked capacitor according to one embodiment of the invention formed as an array of unit cells;

FIG. 5 is a schematic sectional view of a stacked capacitor according to one embodiment of the present invention; and FIG. 6 is a schematic sectional view of a stacked capacitor according to another embodiment of the present invention.

Figure 1:
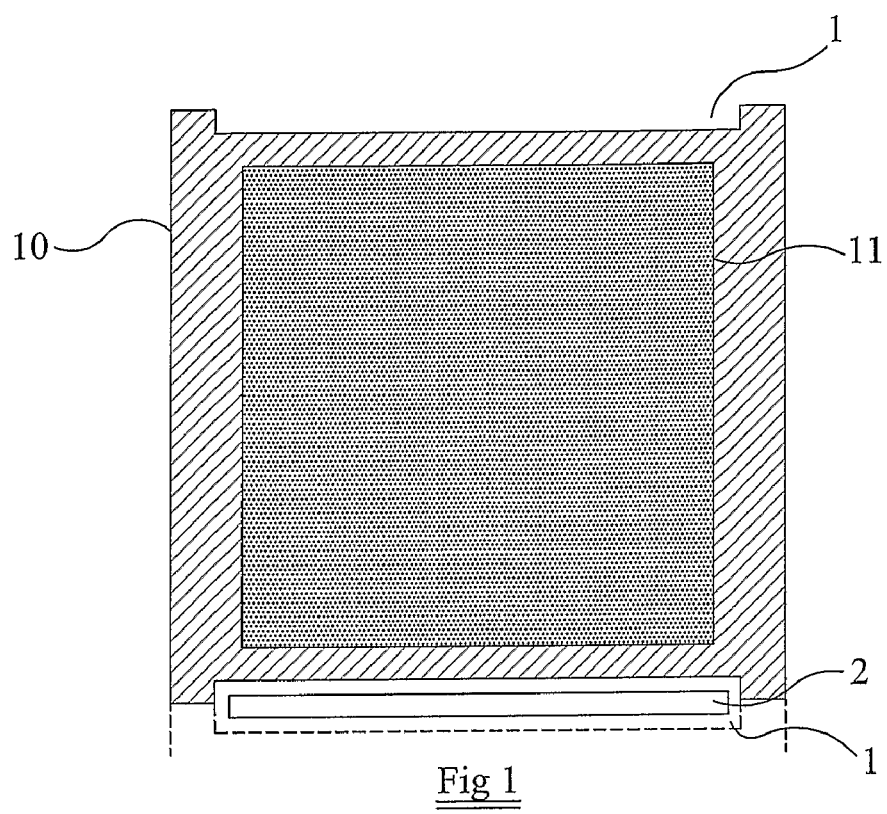

Starting with the basic MiM capacitor structure the inventors have found that it is possible to organise the design of a device such that it is possible to fabricate a composite structure, having a MiM capacitor which is stacked above, and electrically connected in parallel to, an underlying MiM capacitor. In modern CMOS processes four or more process metal layers are used for interconnections between components, and hence a stacked capacitor can be realised using these four (or more) metal layers. In this way the capacitance per unit area of the MiM device can be effectively multiplied (doubled in the case of a dual-stack capacitor, and so on). The device can be described as a "multiple MiM capacitor" or "stacked MiM capacitor".

One feature of the invention is that the same mask (a CM (Capacitor Metal) mask) can be used to photo-lithographically print and etch the top metal plates of each of the MiM devices in the stacked capacitor. By re-using the same mask layer the cost of the photolithographic master masks associated with manufacture of a particular device structure is minimised—keeping the mask count the same as for a single MiM device but achieving a higher capacitance per unit area. Mask costs for IC fabrication can be very high, owing to the materials used, special defect protection schemes (eg pellicle), precision of the mask engraving process and the specialized equipment needed to make them. By minimising the number of photolithographic masks required, the initial cost of creating a new structure may also be minimised.

In a method according to one embodiment of the invention, a first metal layer 10 is deposited on a suitable substrate 22, for example a semiconductor wafer substrate. The first metal layer 10 is insulated from the substrate 22 with a suitable insulating layer 23. The substrate 22 may be, for example, silicon and the insulating layer 23 may be, for example, a suitable thickness layer of silicon dioxide or other dielectric. The wafer substrate 22 is used to fabricate other electrical components which are utilised within the whole electrical circuit of the IC. The first metal layer is an interconnection metal layer of the CMOS process.

The first metal layer 10 is provided with stress-relieving slots 1 by any suitable method, for example etching or lithography. For reasons that will be explained below, a strip or "island" of metal 2 is left within each slot 1 when the slots 1 are defined.

Next, a first insulating layer 20 is deposited over the first metal layer 10. The insulating layer 20 may be a layer of any suitable material, for example a dielectric such as silicon nitride, silicon dioxide or silicon oxynitride. The first metal layer 10 and the insulating layer 20 will form one plate and the insulating layer of an MiM capacitor.

A second metallic layer 11 is then deposited over the insulating layer 20, to form the upper conductive plate of the first MiM capacitor. In this embodiment the second metallic layer 11 is not one of the interconnection metal layers of the CMOS process but is a thin layer of metal (much thinner than the usual connection metal such as the first metal layer 10), so that it fits into the vertical space between the first metal layer 10 and a wiring layer 14 (to be described below), which is typically of the order of 1 μm. The MiM top plate metallic layer 11 (the capacitor metal—CM—layer) is then patterned and etched to define a desired shape. The insulating layer 20 is also etched in this step, so that, as shown in FIG. 5, the extent of the insulating layer 20 corresponds to the extent of the second metallic layer 11.

FIG. 1 is a plan view of the substrate after the second metallic layer 11 and the insulating layer 20 have been patterned. It should be noted that, for the reasons explained above, the capacitor will preferably comprise a large number of unit cells, and FIG. 1 shows only one unit cell (with part of an adjacent cell indicated in broken lines). Moreover, although the unit cell and the patterned second metallic layer 11 are shown as square in FIG. 1 the invention is not limited to this particular shape of unit cell. In the case of a square unit cell, a typical dimension would be 30-35 μm square.

A further insulating layer 21, for example a dielectric layer, is then deposited. This layer acts as an interlayer insulating layer, to ensure electrical isolation between the first metallic layer 10 and further metal layers to be described below. Then a first set of conductive vias 13 is formed through the dielectric layer 21, for example by printing and etching. The vias 13 are formed by creating metal connections, downwards through the dielectric layer 21, for example using tungsten plugs deposited by Low Pressure Chemical Vapour deposition (LPCVD). The vias are intended to provide electrical connection between a wiring layer 14 that is deposited over the upper surface of the dielectric layer 21, as will be described below, and the second metallic layer 11 forming the upper conductive plate of the first MiM capacitor (in the middle of the cell) and the first metallic layer 10 (at the edges of the cell). When the vias are formed, the formation process stops at the second metal layer 11 and cannot pass through it. Thus the integrity of the capacitor dielectric layer 20 is preserved, as it is unaffected by the process of forming the vias 13.

Although the second metal layer is required to be thin, it must be made sufficiently thick that it is not etched through during the process of forming the vias. Also, if the second metal layer were too thin its resistance would be undesirably high.

Figure 2:
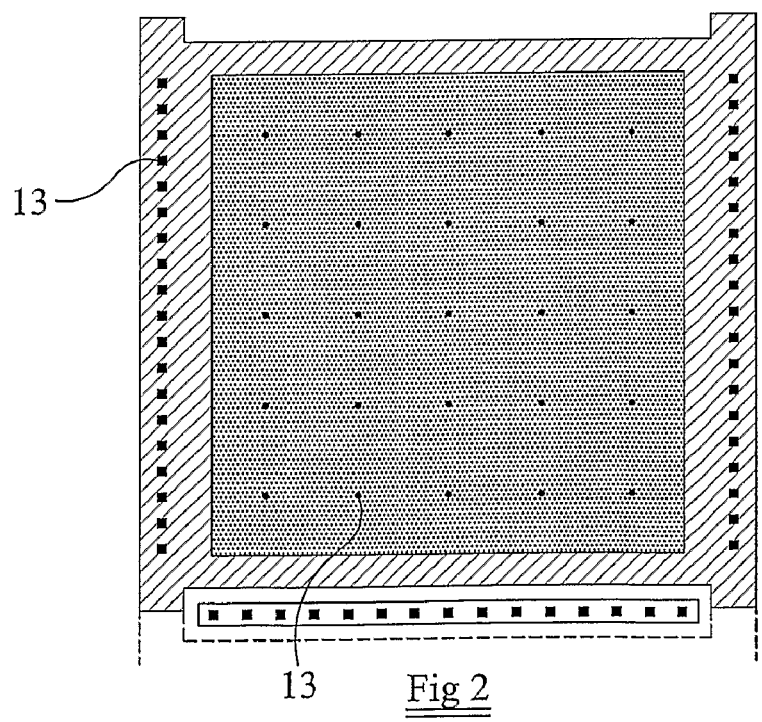

FIG. 2 is a plan view of the substrate after the vias 13 have been formed.

Next a wiring layer 14, for example a metallic layer, is deposited over the insulating layer 21, and is patterned and etched. The wiring layer is one of the interconnection metal layers of the CMOS process so that, as can be seen in FIG. 5, the first MiM capacitor is fabricated between two of the interconnection layers of the CMOS process. The layer 14 is referred to as a "wiring layer" in the context of the first MiM capacitor since it does not form one of the plates of the first MiM capacitor but simply acts as electrical contact to the upper plate of the first MiM capacitor.

As with the first metal layer 10, the wiring layer 14 is provided with slots 15 to prevent instability by giving mechanical stress relief; and the width of the slots 15 is made large enough for a slot to accommodate a metal strip or "island" 3 which makes contact with some vias 13a of the first set of vias, to connect to the first metal layer 10, so that the area within a slot 15 is not wasted.

The slots 15 in the wiring layer 14 may be crossed with, and particularly may be orthogonal or substantially orthogonal to, the slots 1 in the first metallic layer 10, as shown in FIG. 3 which is plan view of the substrate after deposition and patterning of the wiring layer 14. By arranging the slots 15 in the wiring layer 14 orthogonal to the slots 1 in the first metallic layer 10 the capacitor can be wired more efficiently (in terms of the area taken). Since the bottom plate of the capacitor is constituted by part of the first metallic layer 10 and the wiring layer 14 is electrically connected to the top plate of the capacitor, the wiring between the capacitor cells is easily accomplished by tessellating the cells together like a tiled floor (see FIG. 4). The first metallic layer 10 is then (except for the parts 2 of the layer within the slots 1) continuous in one direction (the lateral direction in FIG. 3 or 4) and the wiring layer 14 is (except for the parts 3 of the layer within the slots 15) continuous in the orthogonal direction (the vertical direction in FIG. 3 or 4).

Moreover, if the slots 1,15 extend for less than the entire length or width (as appropriate) of the unit cell, as is the case in FIGS. 1 to 4, then the first metallic layer 10 and the wiring layer 14 are each continuous in both orthogonal directions in the corners of the unit cell. This ensures that the first metallic layer 10 of all adjacent unit cells are connected together both laterally and vertically, as are the wiring layer 14 of all adjacent unit cells. As shown in FIG. 4, the metallic layer 14 is continuous between adjacent cells.) This eliminates the need to provide a special cross-wiring "frame" at the edges of the capacitor array.

A further advantage of the present invention is that the cell structure, the size of the cells, and the interconnection of layers through the slots in intervening layers allow the series resistance of the capacitor to be reduced. This is of particular benefit for RF (radio frequency) applications, which are sensitive to parasitic series resistance.

It should noted that FIG. 5 represent a cross-section along the section A-X-A' indicated in FIG. 3, to allow the slots in both the first metal layer 10 and the wiring layer 14 to be shown clearly in FIG. 5.

Next, another insulating layer 21', for example another dielectric layer, is deposited over the wiring layer 14, to electrically insulate the third metallic layer 14 from overlying layers. A second set of conductive vias 4 is defined through the another insulating layer 21' to the wiring layer 14, for example using a similar method as for the formation of the first set of vias 13 in the insulating layer 21. The vias 4 through the another insulating layer 21' are provided only over the strips 2,3 in the slots 1,15 in the first metal layer 10 and the wiring layer 14.

A second MiM capacitor is then formed over the first MiM capacitor. The steps of forming the second MiM capacitor correspond generally to steps in the formation of the first MiM capacitor.

Initially in the formation of the second MiM capacitor, a third metal layer 10' is deposited over the another insulating layer 21'. The third metal layer 10' is one of the interconnection metal layers of the CMOS process. The third metal layer 10' is provided with stress-relieving slots 1' by any suitable method, for example etching or lithography. A strip or "island" of metal 2' is preferably left within each slot 1' when the slots 1' are defined.

The slots 1' provided in the third metal layer 10' may extend parallel, or substantially parallel, to the slots 1 in the first metal layer 10. In one advantageous embodiment, third metallic layer 10' is etched with the same pattern as the first metal layer 10.

Next, a further insulating layer 20' is deposited over the third metal layer 10'. The third metal layer 10' and the further insulating layer 20' will form the lower plate and the insulating layer of the second MiM capacitor. The further insulating layer 20' may advantageously be made of the same material as the capacitor dielectric layer 20 of the first MiM capacitor, so that the second MiM capacitor has the same characteristics as the first MiM capacitor (although the invention is not limited to this).

A fourth metallic layer 11' is then deposited over the further insulating layer 20', to form the upper conductive plate of the second MiM capacitor. In this embodiment the fourth metallic layer 11' is not one of the interconnection metal layers of the CMOS process but is a thin layer of metal (much thinner than the usual interconnection metal layers). The MiM top plate metallic layer 11' is then patterned and etched to define a desired shape. The further insulating layer 20' is also etched in this step, so that, as shown in FIG. 5, the extent of the further insulating layer 20' corresponds to the extent of the fourth metallic layer 11'.

According to the invention, the fourth metallic layer 11' is etched using the same mask as was used to etch the second metallic layer 11. By using the same masking layer in both etching steps, the number—and hence cost—of the photo-lithographic master masks required for the fabrication is minimised. The present invention makes possible keeping the mask count the same as required for fabrication of a single MiM device while still achieving a higher capacitance per unit area.

Since the fourth metallic layer 11' is etched using the same mask as was used to etch the second metallic layer 11, the fourth metallic layer 11' has the same shape and size, and is co-extensive with, the second metallic layer 11.

A further insulating layer 21", for example another dielectric layer, is then deposited. This layer acts as an interlayer insulating layer, to ensure electrical isolation between the third metallic layer 10' and a second wiring layer that is to be deposited. Then a set of conductive vias 13' is printed and etched through the further insulating layer 21", for example using the same process as described for formation of the conductive vias through the insulating layer 21. The vias 13' are intended to provide electrical connection between, on one hand, a second wiring layer 14' that, as described below, is to be deposited over the upper surface of the further insulating layer 21" and, on the other hand, the fourth metallic layer 11' forming the upper conductive plate of the second MiM capacitor (in the middle of the cell) and the third metallic layer 10' (at the edges of the cell).

Next a second wiring layer 14' is deposited over the further insulating layer 21", and is patterned and etched. The second wiring layer 14' is one of the interconnection metal layers of the CMOS process, so that the second MiM capacitor is fabricated between two of the interconnection layers of the CMOS process. The second wiring layer 14' is referred to as a "wiring layer" in the context of the second MiM capacitor since it does not form one of the plates of the second MiM capacitor but simply acts as electrical contact to the upper plate of the second MiM capacitor. The second wiring layer 14' is provided with slots 15' to prevent instability by giving mechanical stress relief; and the width of the slots 15' is made large enough for a slot to accommodate a metal strip or "island" 3' which makes contact with some vias 13a', to connect to the first metal layer 10, so that the area within a slot 15 is not wasted.

Preferably the slots 15' in the second wiring layer 14' are crossed with, and particularly preferably are orthogonal or substantially orthogonal to, the slots 1' in the third metallic layer 10'. By arranging the slots 15' in the second wiring layer 14' orthogonal to the slots 1' in the third metallic layer 10' the capacitor can be wired more efficiently.

Moreover, if the slots 1',15' are not made along the entire length or width of the unit cell (as is the case for the slots 1,15 in FIGS. 1 to 4), then the second metallic layer 10' and the second wiring layer 14' are each continuous in both orthogonal directions in the corners of the unit cell. This ensures that the second metallic layer 10' of all adjacent unit cells are connected together both laterally and vertically, as are the second wiring layer 14' of all adjacent unit cells.

The second set of vias 4 connect the two stacked capacitors in parallel; they connect the lower plate of one capacitor to the lower plate of the second capacitor, and they connect the upper plate of one capacitor to the upper plate of the second capacitor. The device is thus electrically configured as a single capacitor, rather than as a stack of independent capacitors, so as to provide a capacitor with a high capacitance per unit area.

One further advantage of the stacked capacitor of FIG. 5 is that the first wiring layer 14 and the third metal layer 10' are opposite plates—one is the upper plate of the lower MiM capacitor and the other is the lower plate of the upper MiM capacitor—so there is a small additional capacitance set up between the first wiring layer 14 and the third metal layer 10'. However this additional capacitance is usually very small compared to the capacitances of the two MiM capacitors.

The arrangement of the metal layers, with a dielectric layer (or other insulating layer) between, in a series of capacitor unit cells, with stress-relief slots in each metal layer, ensures that the structure is practical to make, thermally robust and reliable to use. The wiring to connect the metal layers together in the capacitor is preferably accomplished by passing vias through metal stripes which are created within the stress relief slots of each metal layer. This innovation minimizes the amount of capacitor area lost to essential wiring, and so increases the capacitance per unit area. As the stress relief slots are generally required for stability, their practical re-use for the vias is advantageous in the design.

The motivation for providing the insulating layer 21' between the first wiring layer 14 and the third metal layer 10' to separate the lower MiM capacitor from the upper MiM capacitor in this way is to prevent the top of any vias being directly underneath the MiM capacitor dielectric region of the upper MiM capacitor. Vias above an MiM capacitor dielectric region are allowed, and are needed to connect the upper plate of the MiM capacitor to the wiring layer 14,14', but there can be problems if the top of any vias is immediately underneath an MiM capacitor. The reason is that sometimes the vias change the planarity of the overlying metal layer, and this can jeopardise the quality of the dielectric thickness and planarity in the MiM capacitor. Thus, depending on the process used to form the set of first vias 13, it is possible that they may affect the planarity of the upper surface of the first wiring layer 14—and providing the insulating layer 21' over the first wiring layer 14 has the effect of planarising the first wiring layer 14. However, this effect on planarity is seen only for some methods of producing vias, not for all methods. For example, if the vias are made by a polishing technique (eg CMP—chemical mechanical polishing) then the planarity of the metal over them may be very good. In that case it is possible to arrange the second MiM capacitor on top of the wiring layer 14 and omit the third metallic layer 10'. (The wiring between the metallic layers would need to be slightly different to that already described to achieve the stacked MiM capacitor.) This would again achieve the advantages of the invention, by enabling the use of one CM mask to fabricate both MiM capacitors, enabling the division into unit cells, and enabling the inter-capacitor wiring to pass through the stress relief slots.

The invention is not limited to the fabrication of the specific device of FIG. 5, but may be applied to fabricate many other devices. In particular, the method of the invention may be used if there are processes with more than four CMOS metal interconnection layers. For example, if there are six CMOS metal interconnection layers then the same CM mask layer can be re-used three times to create a capacitor which is a parallel combination of three stacked MiM devices—and the capacitance would be triple the value of one MiM capacitor for the same area.

Other multiple combinations are also possible, especially if the planarity of the metal layer formed over vias allows an MiM capacitor to be formed on top of any metal layer. For example a six metal layer process could then provide a stacked MiM structure containing five MiM capacitors while still requiring only one CM mask in its manufacture.

An example of such a stack structure is shown in FIG. 6. The structure of FIG. 6 has six metal layers 10,14,10',14',10'',14 disposed one above another. Each of these layers is a metal interconnection layer of the CMOS process. An insulating layer 20a-20e and a CM thin metal layer 11a-e are disposed on each of the five lowest metal layers 10,14,10',14',10'' so that the metal layer, the associated insulating layer and the associated CM thin metal layer form a respective MiM capacitor. The entire stack then has five times the capacitance per unit area of a standard, single MiM capacitor. The six metal layers 10,14,10',14',10'',14'' are wired together using five sets of vias layers: 13, 16, 17, 18 and 19, such that the first, third and fifth metal layers are electrically connected together and the second, fourth and sixth metal layers are electrically connected together.

The structure of FIG. 6 may be made by a method similar to that described for the manufacture of the structure of FIG. 5. In particular, the thin metal layers 11a-11e may be etched using the same mask for each etching step, in order to minimise the number of masks required for the fabrication process and hence minimise the mask investment cost for a new device.

Using the same mask to etch all of the thin metal layers 11a-11e means that, after etching, the upper electrodes of the MiM capacitors have the same shape and size as, and are co-extensive with, one another.

The insulating layers 20a-20e may all consist of the same material, so that the MiM capacitors all have the same characteristics as one another (although the invention is not limited to this).

In principle the embodiments of FIGS. 5 and 6 may be combined to provide a stacked MiM capacitor structure in which two or more of the MiM capacitors share one of the interconnection layers of the CMOS process as in FIG. 6 and at least one further MiM capacitor does not share one of the interconnection layers of the CMOS process with any other MiM capacitor as in FIG. 5.

The invention has been described with reference to preferred embodiments, but variations are possible on the described examples. As an example, although the invention has been described with reference to MiM capacitors that have metal plates, any suitable conductive material may be used for the plates. One possible modification, for example, is that the stacked structure may be created using polysilicon plates instead of metal plates. In this case some or all of the capacitors in the stacked combination may be formed of an insulating layer (for example a dielectric layer) sandwiched between polysilicon plates/layers instead of between metal plates/layers. Heavily doped polysilicon has a low electrical resistance and can also be covered in a refractory metal silicide to further lower the resistance. The polysilicon plates may also be defined by the same CM mask as used for the capacitor metal layers in the MiM stack.

The invention claimed is:

1. A device comprising:
    a substrate; a first MIM capacitor disposed over the substrate; and a second MiM capacitor disposed over the first MiM capacitor, the first MiM capacitor and the second MiM capacitor being electrically connected in parallel;
    wherein the first MiM capacitor comprises: a first electrically conductive layer; a first insulating layer disposed over the first electrically conductive layer; a second electrically conductive layer; a second insulating layer disposed over the second electrically conductive layer; and a first wiring layer disposed over the second insulating layer and electrically connected to the second electrically conductive layer by one or more via connections through the second insulating layer;
    wherein the second MiM capacitor comprises: a third electrically conductive layer; a third insulating layer disposed over the third electrically conductive layer; a fourth electrically conductive layer; a fourth insulating layer disposed over the fourth electrically conductive layer; and a second wiring layer disposed over the fourth insulating layer and electrically connected to the fourth electrically conductive layer by one or more via connections through the fourth insulating layer;
    wherein the fourth electrically conductive layer is substantially co-extensive with the second electrically conductive layer, and is disposed substantially directly over the second electrically conductive layer;
    wherein slots are provided in the first wiring layer;
    wherein the device comprises first vias extending from the first electrically conductive layer to the third electrically conductive layer, the first vias passing through a slot in the first wiring layer;
    wherein slots are provided in the electrically conductive layer,
    wherein the device comprises second vias extending from the first wiring layer to the second wiring layer, the second vias passing through a slot in the third electrically conductive layer; and
    wherein slots are provided in the second wiring layer.

2. A device as claimed in claim 1 wherein the slots in the first wiring layer extend in a direction crossed with slots in the third electrically conductive layer.

3. A device as claimed in claim 1 wherein the slots in the second wiring layer extend in a direction parallel to the slots in the first wiring layer.

4. A device as claimed in claim 1 wherein slots are provided in the first conductive layer, the slots extending in a direction parallel to the slots in the third electrically conductive layer.

5. A device as claimed in claim 1 and comprising a further insulating layer provided between the first MiM capacitor and the second MiM capacitor.

6. A device as claimed in claim 1 wherein the second electrically conductive layer and the fourth electrically conductive layer each comprise a plurality of discrete regions, each region of the fourth electrically conductive layer being substantially co-extensive with, and disposed substantially directly over, a corresponding region of the second electrically conductive layer.

7. A device as claimed in claim 1 and comprising at least a third MiM capacitor disposed over the second MiM capacitor.

8. A device comprising:
a substrate; a first MiM capacitor disposed over the substrate; and a second MiM capacitor disposed over the first MiM capacitor, the first MiM capacitor and the second MiM capacitor being electrically connected in parallel;
wherein the first MiM capacitor comprises: a first electrically conductive layer; a first insulating layer disposed over the first electrically conductive layer; a second electrically conductive layer; a second insulating layer disposed over the second electrically conductive layer; and a first wiring layer disposed over the second insulating layer and electrically connected to the second electrically conductive layer by one or more via connections through the second insulating layer;
wherein the second MiM capacitor comprises: the first wiring layer; a third insulating layer disposed over the first wiring layer; a third electrically conductive layer; a fourth insulating layer disposed over the third electrically conductive layer; and a second wiring layer disposed over the fourth insulating layer and electrically connected to the fourth electrically conductive layer by one or more via connections through the fourth insulating layer;
wherein the third electrically conductive layer is substantially co-extensive with the second electrically conductive layer, and is disposed substantially directly over the second electrically conductive layer;
wherein slots are provided in the first wiring layer;
wherein the device comprises first vias extending from the first electrically conductive layer to the second wiring layer, the first vias passing through a slot in the first wiring layer;
wherein slots are provided in the second wiring layer, the slots extending in a direction crossed with the slots in the first wiring layer; and
wherein slots are provided in the first conductive layer.

9. A device as claimed in claim 8 wherein the slots in the first conductive layer extend in a direction parallel to the slots in the second wiring layer.

10. A device as claimed in claim 8 wherein the second electrically conductive layer and the third electrically conductive layer each comprise a plurality of discrete regions, each region of the third electrically conductive layer being substantially co-extensive with, and disposed substantially directly over, a corresponding region of the second electrically conductive layer.

11. A device as claimed in claim 8 and comprising at least a third MiM capacitor disposed over the second MiM capacitor, and wherein the device comprises second vias extending from a wiring layer of the third MiM capacitor to the first wiring layer, the second vias passing through a slot in the second wiring layer.

12. A device as claimed in claim 1 and comprising a field insulating layer provided between the substrate and the first MiM capacitor.

13. A device as claimed in claim 1 and comprising a passivation layer provided over the uppermost MiM capacitor.

14. A device as claimed in claim 1 and comprising a plurality of cells, wherein the length of the slots in the first wiring layer is less than the corresponding dimension of the cells, whereby the first wiring layer is continuous between adjacent cells.

15. A device as claimed in claim 4 and comprising a plurality of cells, wherein the length of the slots in the first conductive layer is less than the corresponding dimension of the cells, whereby the first conductive layer is continuous between adjacent cells.

16. A method of manufacturing a device, the method comprising:
depositing a first conductive layer over a substrate;
depositing, in sequence, a first insulating layer and a second electrically conductive layer over the first electrically conductive layer;
patterning the first insulating layer and the second electrically conductive layer using a mask;
depositing a second insulating layer over the second electrically conductive layer;
forming one or more vias in the second insulating layer so as to expose the second conductive layer;
depositing a first wiring layer over the second insulating layer, the first wiring layer making electrical contact with the second conductive layer through the one or more vias in the second insulating layer;
forming one or more slots in the first wiring layer;
depositing a third electrically conductive layer, and forming first vias, passing through a slot in the first wiring layer, to connect the third electrically conductive layer to the first electrically conductive layer;
depositing, in sequence, a third insulating layer and a fourth electrically conductive layer over the third electrically conductive layer;
patterning the third insulating layer and the fourth electrically conductive layer using the same mask as used to pattern the first insulating layer and the second electrically conductive layer;
depositing a fourth insulating layer over the fourth electrically conductive layer;
forming one or more vias in the fourth insulating layer so as to expose the fourth conductive layer;
depositing a second wiring layer over the fourth insulating layer, the second wiring layer making electrical contact with the fourth conductive layer through the one or more vias in the fourth insulating layer;
forming slots in the second wiring layer,
providing slots in the third electrically conductive layer, and
forming second vias to connect the first Wiring layer to the second wiring layer, the second vias passing through a slot in the third electrically conductive layer.

17. A method as claimed in claim 16 further comprising providing the slots in the third electrically conductive layer to extend crossed with respect to the slots in the first wiring layer.

18. A method of manufacturing a device, the method comprising:
depositing a first conductive layer over a substrate;
depositing, in sequence, a first insulating layer and a second electrically conductive layer over the first electrically conductive layer;
patterning the first insulating layer and the second electrically conductive layer using a mask;
depositing a second insulating layer over the second electrically conductive layer;

forming one or more vias in the second insulating layer so as to expose the second conductive layer;

depositing a first wiring layer over the second insulating layer, the first wiring layer making electrical contact with the second conductive layer through the one or more vias in the second insulating layer;

forming one or more slots in the first wiring layer;

depositing, in sequence, a third insulating layer and a third electrically conductive layer over the first wiring layer;

patterning the third insulating layer and the third electrically conductive layer using the same mask as used to pattern the first insulating layer and the second electrically conductive layer;

depositing a fourth insulating layer over the third electrically conductive layer;

forming one or more vias in the fourth insulating layer so as to expose the third conductive layer;

depositing a second wiring layer over the fourth insulating layer, the second wiring layer making electrical contact with the third conductive layer through the one or more vias in the fourth insulating layer; and forming first vias to connect the second wiring layer and the first electrically conductive layer, the first vias passing through a slot on the first wiring layer;

forming slots in the second wiring layer, the slots in the second wiring layer extending in a direction crossed with slots in the first wiring layer; and forming slots in the first conductive layer.

19. A device as claimed in claim 9 and comprising a plurality of cells, wherein the length of the slots in the first conductive layer is less than the corresponding dimension of the cells, whereby the first conductive layer is continuous between adjacent cells.

20. A device as claimed in claim 8 and comprising a field insulating layer provided between the substrate and the first MiM capacitor.

21. A device as claimed in claim 8 and comprising a passivation layer provided over the uppermost MiM capacitor.

22. A device as claimed in claim 8 and comprising a plurality of cells, wherein the length of the slots in the first wiring layer is less than the corresponding dimension of the cells, whereby the first wiring layer is continuous between adjacent cells.

* * * * *

UNITED STATES PATENT AND TRADEMARK OFFICE
CERTIFICATE OF CORRECTION

| | | |
|---|---|---|
| PATENT NO. | : 8,378,451 B2 | Page 1 of 1 |
| APPLICATION NO. | : 12/669733 | |
| DATED | : February 19, 2013 | |
| INVENTOR(S) | : Paul Ronald Stribley et al. | |

It is certified that error appears in the above-identified patent and that said Letters Patent is hereby corrected as shown below:

In the Specification

In Column 10 Line 49, after "provided in the" please insert --third--.

In the Claims

In Column 12 Line 50, please delete "Wiring" and insert therefor --wiring--.

Signed and Sealed this
Eleventh Day of June, 2013

Teresa Stanek Rea
*Acting Director of the United States Patent and Trademark Office*